United States Patent
Grollitsch et al.

(10) Patent No.: US 9,973,195 B2
(45) Date of Patent: May 15, 2018

(54) LOCAL PHASE DETECTION IN REALIGNED OSCILLATOR

(71) Applicant: Infineon Technologies AG, Neubiberg (DE)

(72) Inventors: Werner Grollitsch, Villach (AT); Oleg Vitrenko, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days. days.

(21) Appl. No.: 14/681,239

(22) Filed: Apr. 8, 2015

(65) Prior Publication Data

US 2017/0155395 A1    Jun. 1, 2017

(51) Int. Cl.
| | | |
|---|---|---|
| *H03L 7/00* | (2006.01) | |
| *H03L 7/087* | (2006.01) | |
| *H03L 7/099* | (2006.01) | |

(52) U.S. Cl.
CPC ............ *H03L 7/087* (2013.01); *H03L 7/0997* (2013.01)

(58) Field of Classification Search
CPC ....................................................... H03L 7/00
See application file for complete search history.

(56) References Cited

U.S. PATENT DOCUMENTS

| | | | | |
|---|---|---|---|---|
| 6,952,431 | B1* | 10/2005 | Daily | H03L 7/083 |
| | | | | 370/503 |
| 7,826,584 | B2* | 11/2010 | Paek | H03D 13/004 |
| | | | | 327/147 |
| 9,191,185 | B2* | 11/2015 | Chen | H03K 3/037 |
| 2005/0263138 | A1 | 12/2005 | Sheikh et al. | |
| 2012/0268177 | A1 | 10/2012 | Hogeboom et al. | |
| 2015/0268063 | A1 | 9/2015 | Lepage et al. | |
| 2017/0117907 | A1 | 4/2017 | Grollitsch | |

OTHER PUBLICATIONS

Prosecution History from U.S. Appl. No. 14/681,455, dated from May 19, 2017 through Sep. 11, 2017, 32 pp.
Office Action from U.S. Appl. No. 14/681,455, dated Dec. 7, 2017, 8 pp.
Response to Office Action dated Dec. 7, 2017, from U.S. Appl. No. 14/681,455, filed Dec. 20, 2017, 3 pp.
Notice of Allowance from U.S. Appl. No. 14/681,455, dated Feb. 22, 2018, 5 pp.

* cited by examiner

*Primary Examiner* — Hai L Nguyen
(74) *Attorney, Agent, or Firm* — Shumaker & Sieffert, P.A.

(57) ABSTRACT

Representative implementations of devices and techniques provide reduced jitter and local phase detection for a controlled oscillator. An edge of a reference signal is injected at a point within the oscillator, and replaces an edge of the generated oscillation signal at the injection point. A phase difference of the injected reference signal and the oscillation signal is measured locally and is used to tune the oscillator.

23 Claims, 8 Drawing Sheets

LOCAL PHASE DETECTION IN REALIGNED OSCILLATOR

BACKGROUND

Phase-locked loop (PLL) devices are control systems that generate signals having a fixed relationship to the phase of a reference signal. Typically, a phase-locked loop device generates a desired signal in response to both the frequency and the phase of the reference signal as well as a control signal. Often this includes raising or lowering the frequency of a frequency generator, such as a digitally controlled oscillator (DCO), a voltage controlled oscillator (VCO), or the like, until a true or modified form (a fraction, for example) of the oscillator output signal is matched with the reference signal in both frequency and phase. Phase-locked loops are widely used in radio, telecommunications, computers, and other electronic applications.

Phase and/or frequency detectors can be used with PLL devices to provide phase frequency information for controlling and tuning a frequency of the generated output signal. However, time delays in detecting the phase/frequency information or in transmitting the information to control portions of the PLL can create disturbances to the PLL clock. For example, misalignment due to a time delay can create reference spurs and increased phase noise of the clock, leading to increased jitter, or variations in the timing of the rising and/or falling edges of the periodic signal. Accumulated jitter can increase in-band phase noise, and in a worst-case scenario, misalignment can lead to unlock of the PLL.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED INSCRIPTION

Overview

Figure 1:
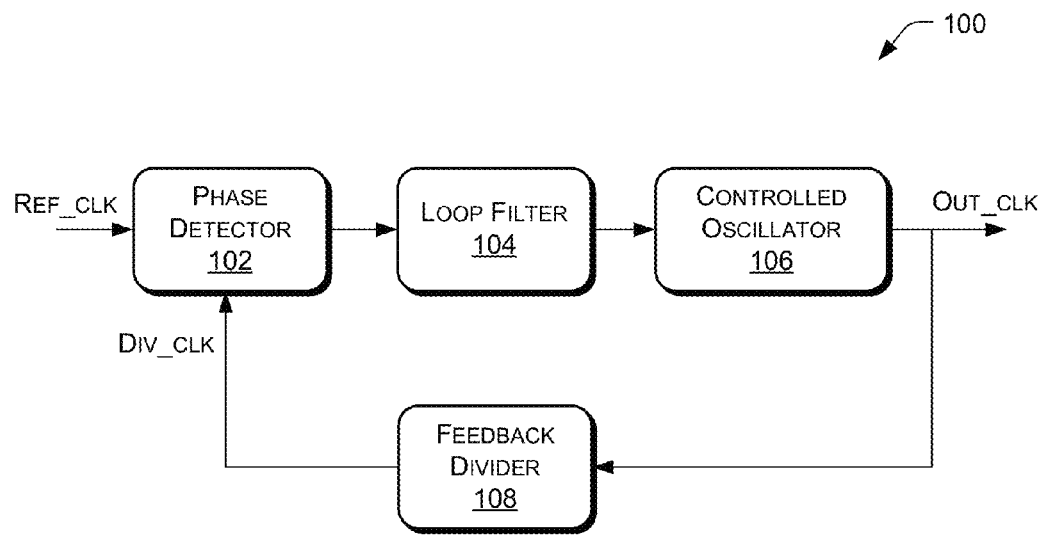
FIG. 1 is block diagram of an example PLL circuit, according to an implementation.

Representative implementations of devices and techniques provide reduced jitter and local phase detection for a controlled oscillator, such as a digitally controlled oscillator (DCO), a voltage controlled oscillator (VCO), or the like. In an implementation, an edge of a reference signal is injected at a point within the oscillator, and replaces an edge of the generated oscillation signal at the injection point. In another implementation, the edge of the reference signal may be injected at one of multiple points within the oscillator, or multiple edges of the reference signal may be injected at various points, according to a predetermined timing and pattern. In an implementation, a phase difference of the injected reference signal and the oscillation signal is measured locally (e.g., within the oscillator) and is used to tune the oscillator.

In an example implementation, an oscillator circuit, such as ring oscillator, for example, is comprised of a plurality of controllable inverting stages and a multiplexing stage. The multiplexer is coupled to an output of an inverter of the plurality of inverters at a first input of the multiplexer and coupled to an input of another inverter of the plurality of inverters at an output of the multiplexer, forming a loop. In the implementation, the loop circuit generates a oscillating signal.

In one implementation, the oscillator includes multiple multiplexers (in one example, the oscillator may include an equal quantity of inverters and multiplexers). In the implementation, each multiplexer is coupled to an output of an inverter at a first input of the multiplexer and each inverter is coupled to an output of a multiplexer at an input of the inverter, forming a loop of alternating inverters and multiplexers.

In various implementations, each multiplexer is arranged to receive a reference signal at a second input of the multiplexer and to output the reference signal when an enable signal received at the multiplexer is in a first state and to output the oscillation signal (received at the first input of the multiplexer from an inverter) when the enable signal is in a second state. In other words, when the multiplexer is enabled (or the reference signal input of the multiplexer is selected based on the enable signal) an edge of the reference signal is replaced for a corresponding edge of the oscillation signal. This resets the affected edge of the oscillation signal, realigns the oscillator, and reduces jitter of the oscillation signal.

In an implementation, the reference signal edge may be injected at any of multiple stages of the oscillator, when a multiplexer is enabled at that stage. Further, in the case of multiple multiplexers, each of the plurality of multiplexers may be enabled in its turn according to a predetermined frequency and in a predetermined order. For example, the oscillator loop is opened at periodic intervals and at various points (e.g., oscillator stages), and an edge of the reference signal replaces a corresponding edge of the oscillation signal at the intervals and at the injection point.

In an implementation, a phase detector is coupled to the first input of the multiplexer at a first input of the phase detector and is coupled to the second input of the multiplexer at a second input of the phase detector. In various implementations, the phase detector is located within the oscillator, allowing for a local measurement at the multiplexer (or at the output of the inverter feeding the multiplexer). In the implementations, the phase detector measures a phase and/or difference between the injected reference signal ad the oscillation signal at the injection point of the circuit. The local phase measurement mitigates delay effects on the timing of the reference signal and the oscillator signal, and thus reduces jitter, reference spurs, and other negative effects caused by misalignment.

Various implementations and arrangements are discussed with reference to electrical and electronics components and circuits. While specific components are mentioned, this is not intended to be limiting, and is for ease of discussion and illustrative convenience. The techniques and devices discussed with reference to a PLL arrangement are applicable to various types of designs of PLL arrangements, circuits (e.g., integrated circuits, analog circuits, digital circuits, mixed circuits, etc.), groups of components, structures, and the like. Further, the oscillators discussed and illustrated need not be applied solely to PLLs, and may be employed with various other circuits or systems that use a generated periodic or controlled clock signal.

Implementations are explained in more detail below using a plurality of examples. Although various implementations and examples are discussed here and below, further implementations and examples may be possible by combining the features and elements of individual implementations and examples.

Example PLL

FIG. 1 is block diagram of an example PLL arrangement ("PLL") 100, according to an implementation. The PLL 100 represents an example environment whereby the techniques and devices discussed herein may be applied. The techniques, components, and devices described herein with respect to the PLL 100 are not limited to the illustration in FIG. 1, and may be applied to other designs, types and constructions of PLLs or other similar structures without departing from the scope of the disclosure. In some cases, alternative components may be used to implement the techniques described herein.

In an example implementation, as shown in FIG. 1, the PLL 100 may include a phase detector 102, a loop filter 104, a controlled oscillator (CO) 106, and a feedback divider 108. In general terms, the CO 106 may be arranged to produce an output signal (out_clk) having a frequency proportional to a value of a digital control word or other frequency control signal. The frequency control signal can be the result of a reference clock signal (ref_clk) and a modified clock signal (div_clk) based on the output out_clk of the CO 106, and is used to adjust or "lock" the frequency of the CO 106 to a desired output frequency. The output out_clk of the CO 106 is also the output of the PLL 100.

In various implementations, the CO 106 may comprise one of carious controlled oscillators, such as a digitally controlled oscillator (DCO), a digitally controlled ring oscillator (DCRO), a voltage controlled oscillator (VCO), or the like.

As shown in FIG. 1, the output out_clk of the CO 106 is fed back through the feedback divider 108. The feedback divider 108 divides the frequency of the output signal out_clk by the divider value to produce the modified clock signal div_clk.

In the example, the reference clock signal ref_clk and the modified clock signal div_clk are received by the phase detector 102. In other implementations, the phase detector 102 receives the reference clock signal ref_clk and the output signal out_clk ("oscillation signal"). In an implementation, the phase detector 102 senses a phase difference between the reference clock signal ref_clk and the output clock signal out_clk or the modified clock signal div_clk and outputs a signal (e.g., error signal, phase difference, etc.) that is a representation of the phase difference detected. In one implementation, as discussed further below, the phase detector 102 may be arranged to detect whether a phase of the reference clock signal ref_clk leads or lags a phase of the output clock signal out_clk or modified clock signal div_clk.

The loop filter 104 is arranged to form the frequency control signal based on the representation of the phase frequency difference from the phase detector 102. In various implementations, the loop filter 104 comprises a digital or analog loop filter. The frequency control signal may contain the phase difference information from the output of the phase detector 102. Accordingly, the frequency control signal prompts the CO 106 to increase its output frequency or decrease its output frequency based on the phase difference indicated by the frequency control signal. For example, if the reference clock signal ref_clk is leading the output clock signal out_clk or modified clock signal div_clk, the frequency control signal may prompt the CO 106 to increase its output frequency (via a charge pump or a digital control, for example). Conversely, if the reference clock signal ref_clk is lagging the output clock signal out_clk or modified clock signal div_clk, the frequency control signal may prompt the CO 106 to decrease its output frequency. In alternate implementations, this may occur in a different manner for the leading and lagging conditions.

In alternate implementations, variations of a PLL 100 are also within the scope of the disclosure. The variations may have fewer elements than illustrated in the example shown in FIG. 1, or they may have more or alternative elements than those shown.

Example Injection-Locked PLL

Figure 2:
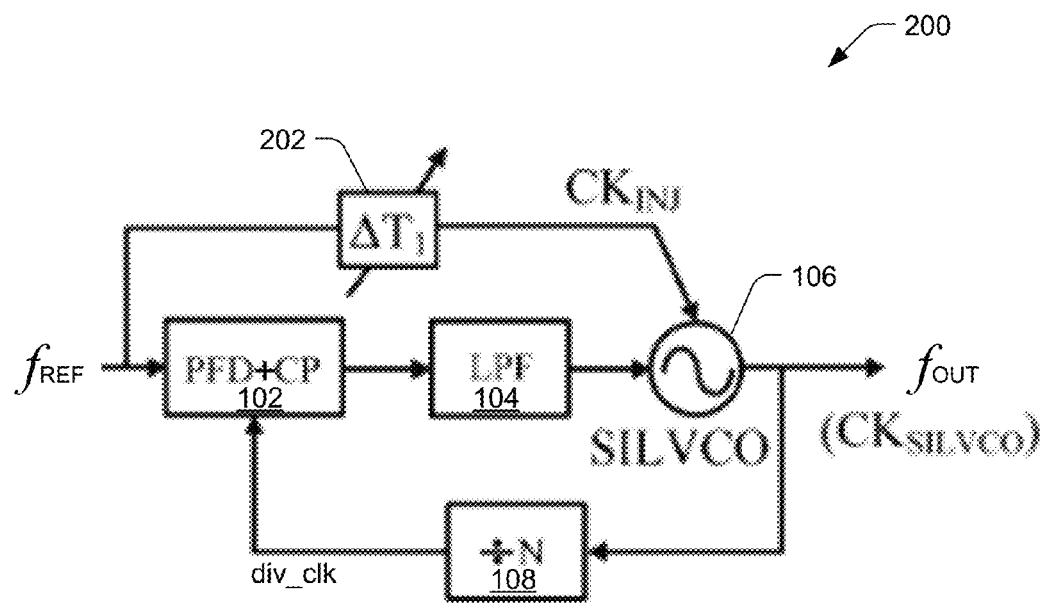
FIG. 2 if a block diagram of another example PLL circuit, including oscillator injection, according to an implementation.

FIG. 2 is a block diagram of another example PLL arrangement ("PLL") 200, according to an implementation. The PLL 200 illustrates and example PLL with a voltage controlled oscillator (VCO) 106, phase/frequency detector and charge pump 102, low pass filter 104, and frequency divider 108. The design of the PLL 200 of FIG. 2 is not intended to be limiting, and an example PLL 200 may include other analog and digital PLL arrangements having alternate or additional components (such as a digitally controlled ring oscillator (DCRO), for example).

Figure 3A:
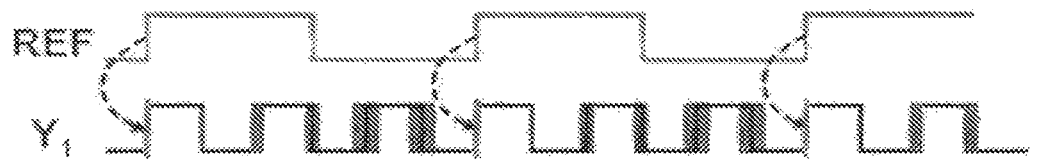
FIG. 3A is a signal diagram showing an example of reference signal injection, according to an implementation.
Figure 3B:
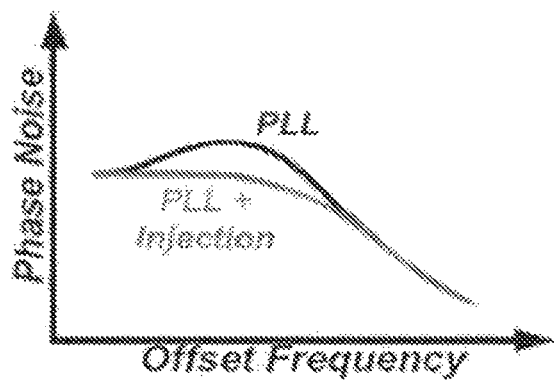
FIG. 3B is a graphical representation of the phase noise behavior, illustrating an example result of reference signal injection, according to an implementation.

The PLL 200 illustrates an example PLL having a clock injection "CLKinj" at the oscillator 106. Injection locked PLLs, such as the PLL 200, offer the possibility of reducing the jitter of the controlled oscillator 106 by injecting a reference clock, CLKinj, directly into the oscillator 106 core. For example, as shown in FIG. 3A, injecting the reference clock ("REF") can reset the VCO 106 clock phase ("Y1") with the reference clock phase. This arrangement provides a technique of "resetting" the jitter accumulated during a reference cycle, for example. In various arrangements, as shown in FIG. 3B, the in-band phase noise may be reduced as a result. The cut-off frequency shown in FIG. 3B may occur at approximately Fref/2 (depending on the injection strength).

By making use of the injection technique illustrated, ring oscillators for example, can be used to replace LC-oscillators for high accuracy applications, making efficient use of die area. However, in some examples, the PLL arrangement 200 may be limited to synthesis of integer-N multiple frequencies of the reference frequency, due to the reference clock. CLKinj, being injected into the same oscillating node of the VCO 106 in each cycle, for instance.

As shown in FIGS. 1 and 2, there my be a timing delay between the reference signal (ref_clk, Fref) and the output signal (out_clk, Fout) or the modified output signal (div_clk), based on time taken for the output signal (out_clk, Fout) to be fed back through the feedback divider 108 (or a like feedback path), become the modified output signal (div_clk) (if it applies), and be fed to the phase detector 102 for measurement. This timing delay can result in a signal misalignment, particularly with injection-locked PLLs such as PLL 200, which can lead to disturbance of the PLL clock (out_clk, Fout) creating reference spurs, additional phase noise, and increased jitter. As mentioned above, in a worst-case scenario, the misalignment could result in unlock of the PLL 200.

Figure 4A:
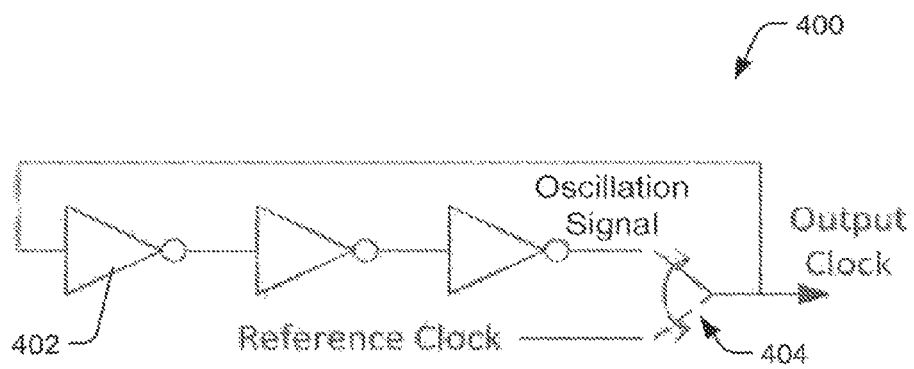
FIG. 4A is a block diagram illustrating an example oscillator realignment technique, according to an implementation.

Additionally, in order to track the reference signal frequency (ref_clk, Fref) (e.g., correct the frequency due to temperature and/or supply variations), a regulating loop 202 can be used as shown in FIG. 2. The goal is to match the timing of the injection point (e.g., the reference signal edge) to the oscillator's clock edge. However, timing differences between the injection point and the correcting circuit (PFD 102) can result in increased reference spurs and jitter in some cases, or lead to additional area due to the added regulating circuitry Example Oscillator Realignment FIG. 4A is a block diagram illustrating an example oscillator realignment technique, according to an implementation. The technique is illustrated using an example oscillator 400, which may be employed as the oscillator 106 with a PLL arrangement such as the PLL 100 of FIG. 1, the PLL 200 of FIG. 2, or the like, according to various implementations. Further, the oscillator 400 may be employed in various other circuits and/or systems that use a generated periodic or controlled clock signal.

In one implementation, the oscillator 400 is a ring oscillator circuit. In other implementations, the oscillator 400 is another type of oscillator circuit. In various implementations, the oscillator 400 includes a plurality of inverters 402 coupled in series, forming a loop. When the inverters 402 are energized, the circuit 400 generates an oscillating signal ("oscillation signal") which comprises the output clock of the oscillator 400. In various implementations, the output clock is the output of a PLL, such as PLL 100, 200, when the oscillator 400 is used with a PLL.

In an implementation, as shown in FIG. 4A, the output clock comprises the generated oscillation signal when a selector 404 is in a first state (as indicated by the first or top channel of the selector 404). As also shown in FIG. 4A, the circuit 400 is arranged to receive a reference clock. In an implementation, the reference clock replaces the oscillation signal as a portion of the output clock when the selector 404 is in a second state (as indicated by the second or lower channel of the selector 404). Since the output clock of the oscillator 400 is determined by the selector 404, the selector 404 can be arranged to allow the reference clock (i.e., an edge of the reference clock) to replace the oscillation signal (i.e., an edge of the oscillation signal) periodically to "reset" the oscillation signal (for example, by selecting the reference clock with the selector 404 during a brief window surrounding a predetermined oscillation signal edge to be replaced, and then re-selecting the oscillation signal with the selector 404) which realigns the oscillator 400 from within the oscillator 400.

Figure 4B:
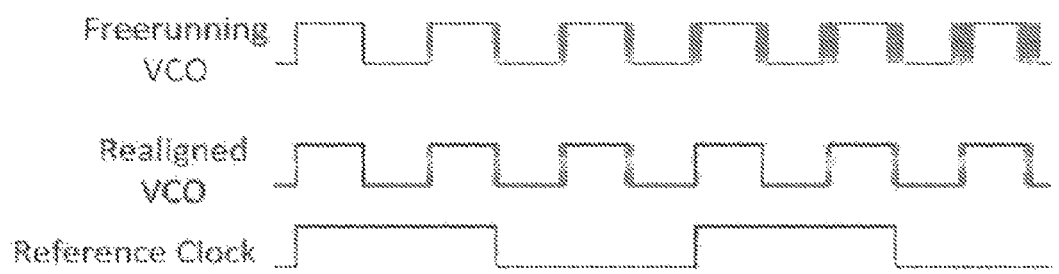
FIG. 4B is a signal diagram showing example results of realigning an oscillator, according to an implementation.

FIG. 4B is a signal diagram showing example results of realigning the oscillator 400, according to an implementation. The "Freerunning VCO" signal illustrates an accumulation of jitter that may occur on an output clock with an unaligned and not regulated oscillator 400. The jitter continues to accumulate on the edges of the output clock, and can cause negative effects as described above.

The "Realigned VCO" signal illustrates one example of resetting the clock signal at predetermined periodic intervals. As shown in FIG. 4B, the jitter accumulates on the output clock edges unless reset using the reference clock, as described above. For example, referring to the "Reference Clock" signal and the "Realigned VCO" signal, in the example illustrated, each rising edge of the reference clock is replaced for a corresponding edge of the oscillation signal, resetting the influence of jitter, and forming the "Realigned VCO" signal.

Figure 5:
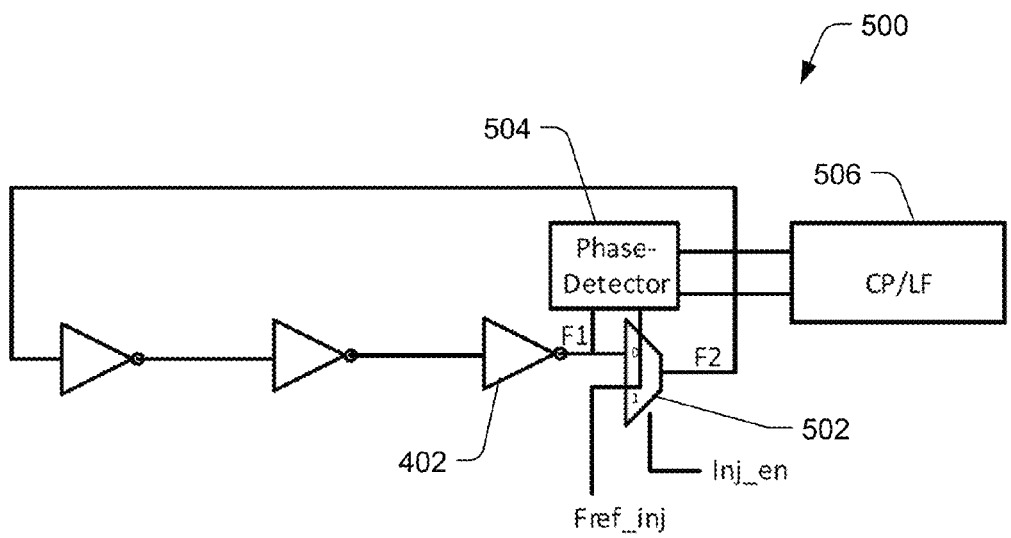
FIG. 5 is a schematic diagram of an example realigned oscillator circuit, according to an implementation.

FIG. 5 is a schematic diagram of an example realigned oscillator circuit 500, which may be employed as the oscillator 106 with a PLL arrangement 100, 200, or the like, according to an implementation. For example, the oscillator 500 uses the realignment techniques described with reference to the oscillator 400. In alternate implementations, the oscillator 500 may include fewer, alternate, or a greater number of components, and use the realignment technique described.

In an implementations, as shown in FIG. 5, the oscillator 500 includes a plurality of inverters 402 coupled in series. In the implementation, the oscillator 500 also includes a multiplexer 502 coupled to an output of an inverter 402 of the plurality of inverters 402, at a first input of the multiplexer 502. The multiplexer 502 is also coupled to an input of another inverter 402 of the plurality of inverters 402 at an output of the multiplexer 502. In the implementation, the plurality of inverters 402 and the multiplexer 502 are arranged in a loop and generate as oscillating signal (i.e., the oscillation signal) when energized.

In an implementation, as illustrated in FIG. 5, the oscillator 500 is periodically realigned via injection of a reference signal, as described with reference to oscillator 400. For example the multiplexer 502 of the oscillator 500, performs the functions of the selector 404 of the oscillator 400. In the implementation, the multiplexer 502 is arranged to receive the reference signal (Fref_inj, for example) at a second input of the multiplexer 502, as shown in FIG. 5. The multiplexer 502 outputs the reference signal (instead of the oscillation signal) when as enable signal (e.g., Inj_en, for example) received at the multiplexer 502 is in a first state. The multiplexer 502 outputs the oscillation signal (received at the first input of the multiplexer 502) when the enable signal is in a second state. In other words, the multiplexer 502 selects either the oscillation signal or the reference signal for output from the multiplexer 502, based on the selection state of the enable signal.

In an implementation, the reference signal comprises a periodic pulse signal having a rising edge and a falling edge on each pulse. The circuit 500 loop is opened at periodic intervals and an edge of the reference signal replaces an edge of the oscillation signal at the intervals. That is, one of the rising edge or the falling edge of the reference signal replaces a corresponding rising or falling edge of the oscillation signal at the output of the multiplexer 502 when the enable signal received at the multiplexer 502 is in the first state. In the implementation, replacing the edge of the reference signal for the edge of the oscillation signal adjusts a timing of the oscillation signal (since the reference signal edge becomes the new oscillation signal edge at the injection point), which reduces or eliminates accumulated jitter and phase noise.

In an implementation, as shown in FIG. 5, the oscillator 500 includes a phase detector 504 coupled to the first input of the multiplexer 502 at a first input of the phase detector 504 and coupled to the second input of the multiplexer 502 at a second input of the phase detector 504. In an implementation, the phase detector 504 is arranged to measure a phase difference between the oscillation signal and the reference signal at a predetermined point (for example at the reference signal injection point) within the ring oscillator circuit 500 and to output a difference signal based on the measuring.

In an implementation, the phase detector is located within a core of the oscillator circuit 500 and is integral to the oscillator circuit 500. For example, being within the core of the oscillator 500 means that the phase detector is located directly inside the oscillator 500, local to the multiplexer 502, reducing a transmission path of the measured reference signal and oscillation signal to a minimum. With a minimum transmission path, there is also a minimum delay time between the measure reference signal and oscillation signal, reducing or eliminating misalignment of these signals.

In an implementation, as shown in FIG. 5, a charge pump and/or a loop filter ("CP/LF") 506 can be coupled to an output of the phase detector 504. In the implementation, the charge pump and/or loop filter 506 is arranged to tune a frequency of the oscillation signal based on the output of the phase detector 504. For example, the phase detector outputs an error signal (e.g., difference signal) to the charge pump and/or the loop filter 506, and the charge pump and/or the loop filter 506 increases or decreases a frequency of the oscillation signal based on the error signal.

Figure 6:
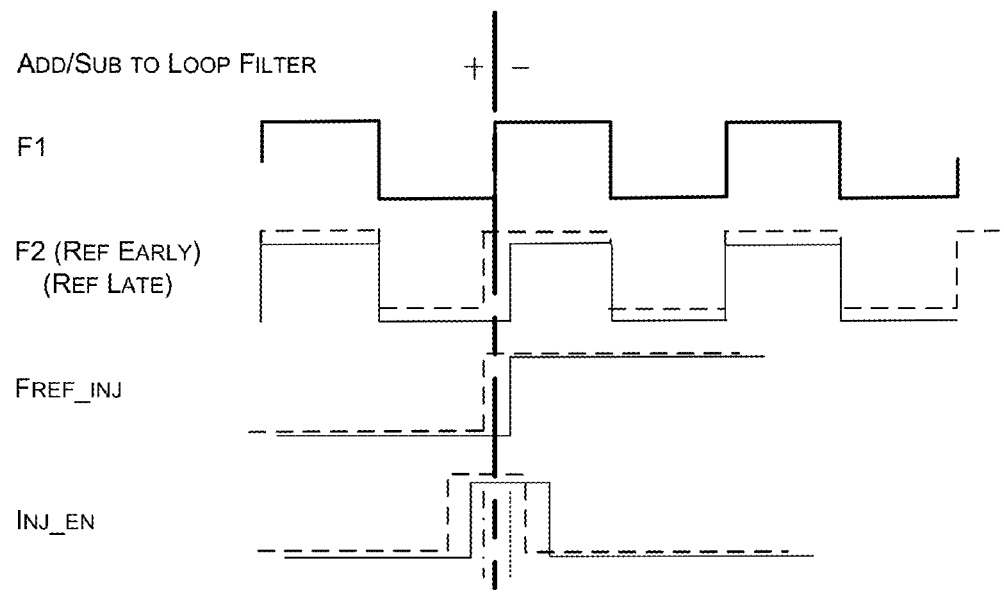
FIG. 6 is a signal timing diagram showing example realigned oscillator circuit signals, according to an implementation.

FIG. 6 is a signal timing diagram showing signals of the example realigned oscillator circuit 500, with local phase detector 504, according to an implementation. For example, the F1 signal represents the oscillation signal, which is the output of an inverter 402 or the first input to the multiplexer 502. The F2 signal represents the output of the multiplexer 502 in two possible states, where the reference signal leads the oscillation signal (the dashed line) and where the reference signal lags the oscillation signal (the solid line). The "Fref_inj" signal represents the injected edge of the reference signal in the leading (dashed line) or lagging (solid line) states. In this example, the edge is a rising edge of the reference signal. In other examples, the falling edge may be used in a same way.

The "Inj_en" signal represents the enable signal in two possible states, one for the leading reference signal and another for the lagging reference signal. For example, when the "Inj_en" signal is low, it represents the enable signal in the second state and when the "Inj_en" signal is high, it represents the enable signal in the first state. In an implementation, the window formed while the enable signal is in the second state is intended to encompass the edge of the reference signal and the corresponding edge of the oscillation signal to be replaced by the edge of the reference signal.

In an implementation, the injection clock is used to evaluate the phase difference between the reference signal and the oscillation signal. In other words, the enable window (when the enable signal is in the first state) is formed around the injected edge of the reference signal. If the time difference between the edges of F1 and Fref_inj fall inside this window (which is usually the case, when the PLL is locked) F1 is decoupled from F2 and the phase detector 504 can measure the phase difference between F1 and Fref_inj, ad can evaluate whether F1 is leading or lagging Fref_inj.

For example, when Fref_inj leads F1, the charge pump adds charge to the loop filter (shown as 506), correcting the oscillation signal to a higher frequency, and when Fref_inj lags F1, the charge pump reduces charge to the loop filter, correcting the oscillation signal to a lower frequency.

Figure 7:
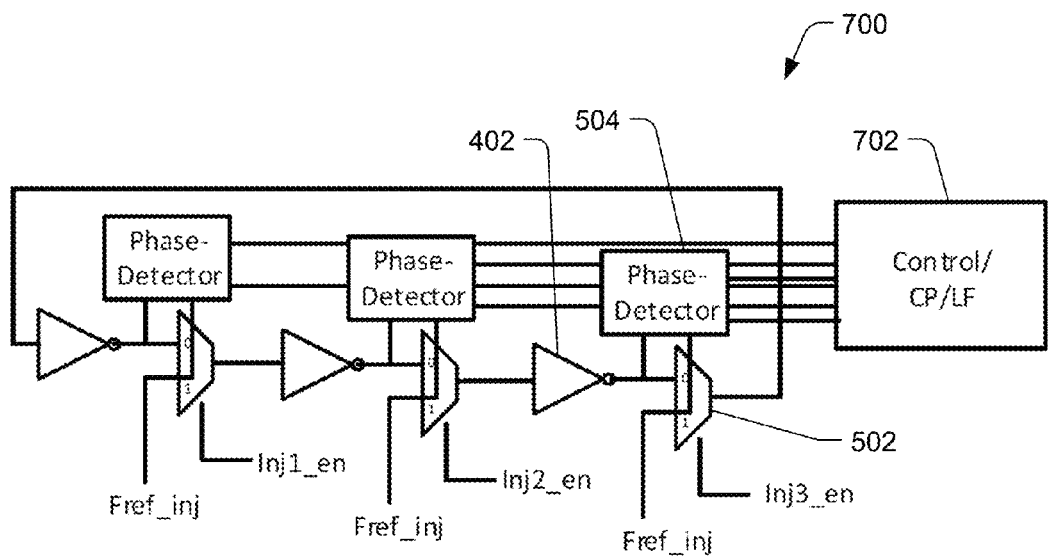
FIG. 7 is a schematic diagram of an example realigned oscillator circuit, according to another implementation.

FIG. 7 is a schematic diagram of another example realigned oscillator circuit 700, which may be employed as the oscillator 106 with a PLL arrangement 100, 200 or the like, according to an implementation. In the implementation, the oscillator 700 includes a plurality of multiplexers 502 coupled to the plurality of inverters 402 such that a multiplexer 502 is coupled to an output of each inverter 402 at a first input of the multiplexer 502 and an inverter 402 is coupled to an output of each multiplexer 502 at an input of the inverter 402. In the implementation, the plurality of inverters 402 and the plurality of multiplexers 502 generate an oscillating signal (i.e., the oscillation signal) when energized. In one example, an oscillator 700 includes a same quantity of inverters 402 and multiplexers 502 alternately coupled in a loop.

As above, each multiplexer 502 performs the function of the selector 404. For example, the multiplexer 502 replaces an edge of the oscillation signal with an edge of the reference signal when the second input of the multiplexer 502 is selected via the enable signal. In an implementation, each multiplexer 502 is arranged to receive the reference signal (Fref_inj, for example) at a second input of the multiplexer 502, as shown in FIG. 7. In the implementation, a multiplexer 502 outputs the reference signal (instead of the oscillation signal) when an enable signal (e.g., Inj1_en, Inj2_en, Inj3_en) received at the multiplexer 502 is in a first state. Further, the multiplexer 502 outputs the oscillation signal (received at the first input of the multiplexer 502) when the enable signal is in a second state.

In an implementation, a reference signal edge replaces the corresponding oscillation signal edge at the point of injection (e.g., at an enabled multiplexer 502) as discussed above. In the implementation, injecting the reference signal edge at a multiplexer 502 and replacing it for the oscillation signal edge realigns the oscillation signal, adjusts a timing of the oscillation signal (since the reference signal edge becomes the new oscillation signal edge at the injection point), and thus reduces jitter and phase noise of the oscillation signal.

In various implementations, the reference signal may be injected according to a predetermined frequency and/or pattern, as desired to control jitter of the oscillator 700. In alternate implementations, the reference signal may be injected using other components (rather than a multiplexer 502, for instance) that allow the reference signal edge to replace a corresponding oscillation signal edge at multiple points within an oscillator 500, 700.

In various implementations, the reference signal is injected once per reference signal cycle, or according to another predetermined pattern. The reference signal edge is injected at various points (e.g., multiplexers 502) during successive cycles. In an implementation, the multiplexers 502 are enabled independently in an order that is not sequential to an order of their electrical coupling within the circuit 700. In alternate implementations, multiple multiplexers 502 may be enabled simultaneously and may be enabled in an order of their electrical coupling within the circuit 700.

In another implementation, the oscillator circuit 700 is capable of synthesizing an output frequency that is a fractional multiple of the reference frequency, based on the multiple inverter 402/multiplexer 502 stages of the circuit 400. In the implementation, the multiplexers 502 of the plurality of multiplexers are subsequently enabled (in a predetermined pattern, for example) at a frequency comprising a combination of an integer multiplication factor and a fractional multiplication factor of a frequency of the reference signal. In various implementations, greater resolution can be achieved when the injection occurs at every second, third, etc. reference cycle. In other implementations, an increase of resolution can be achieved by injecting falling edges of the reference signal onto the oscillation signal.

In an implementation, the oscillator 700 includes a plurality of phase detectors 504 coupled to the plurality of multiplexers 502. For instance, the oscillator 700 may include a phase detector 504 for each stage of the oscillator 700, or the oscillator 700 may include fewer or more phase detectors 504. In one example, a phase detector 504 is coupled to a first input of a multiplexer 502 at a first input of the phase detector 504 and to a second input of the multiplexer 502 at a second input of the phase detector 504.

In the implementation, the plurality of phase detectors 504 detect a phase difference between the oscillation signal and the reference signal at the multiplexer 502 inputs and output a difference signal to a control module 702 based on the detecting. In one example, the phase detectors 504 can detect whether the reference clock signal edge leads or lags the oscillation signal edge at the reference signal injection point.

In an implementation, as shown in FIG. 7, the oscillator 700 includes a control module 702 arranged to realign a phase of the oscillation signal by enabling the multiplexers 502 and injecting an edge of the reference signal into a multiplexer 502 during a time window encompassing an edge of the oscillation signal. In the implementation, the edge of the reference signal replaces a corresponding edge of the oscillation signal during the time window. In the implementation, the control module 702 matches a timing delay between the injected reference signal at the second input of an enabled multiplexer 502 and the oscillation signal at the first input of the multiplexer 502.

In an implementation, as shown in FIG. 7, the control module 702 includes the charge pump and/or loop filter 506 discussed above. For example, the control module 702 tunes the frequency of the oscillator 700 by increasing or decreasing a frequency of the oscillation signal based on the difference signal from the phase detectors 504.

In alternate implementations, the oscillator 400, 500 or 700 and/or the PLL 100, 200 may include fewer, additional, or alternate components and remain within the scope of the disclosure. Further, the techniques, components, and devices described herein with respect to the implementations are not limited to the illustrations in FIGS. 1-7, and may be applied to other oscillators and/or PLLs, including various devices and designs, without departing from the scope of the disclosure. In some cases, additional or alternative components may be used to implement the techniques described herein. Further, the components may be arranged and/or combined in various combinations. It is to be understood that an oscillator 400, 500, or 700 and/or PLL 100, 200 may be implemented as a stand-alone device or an part of another system (e.g., integrated with other components, systems, etc.).

In various implementations, additional or alternative components may be used to accomplish the disclosed techniques and arrangements.

Representative Process

Figure 8:
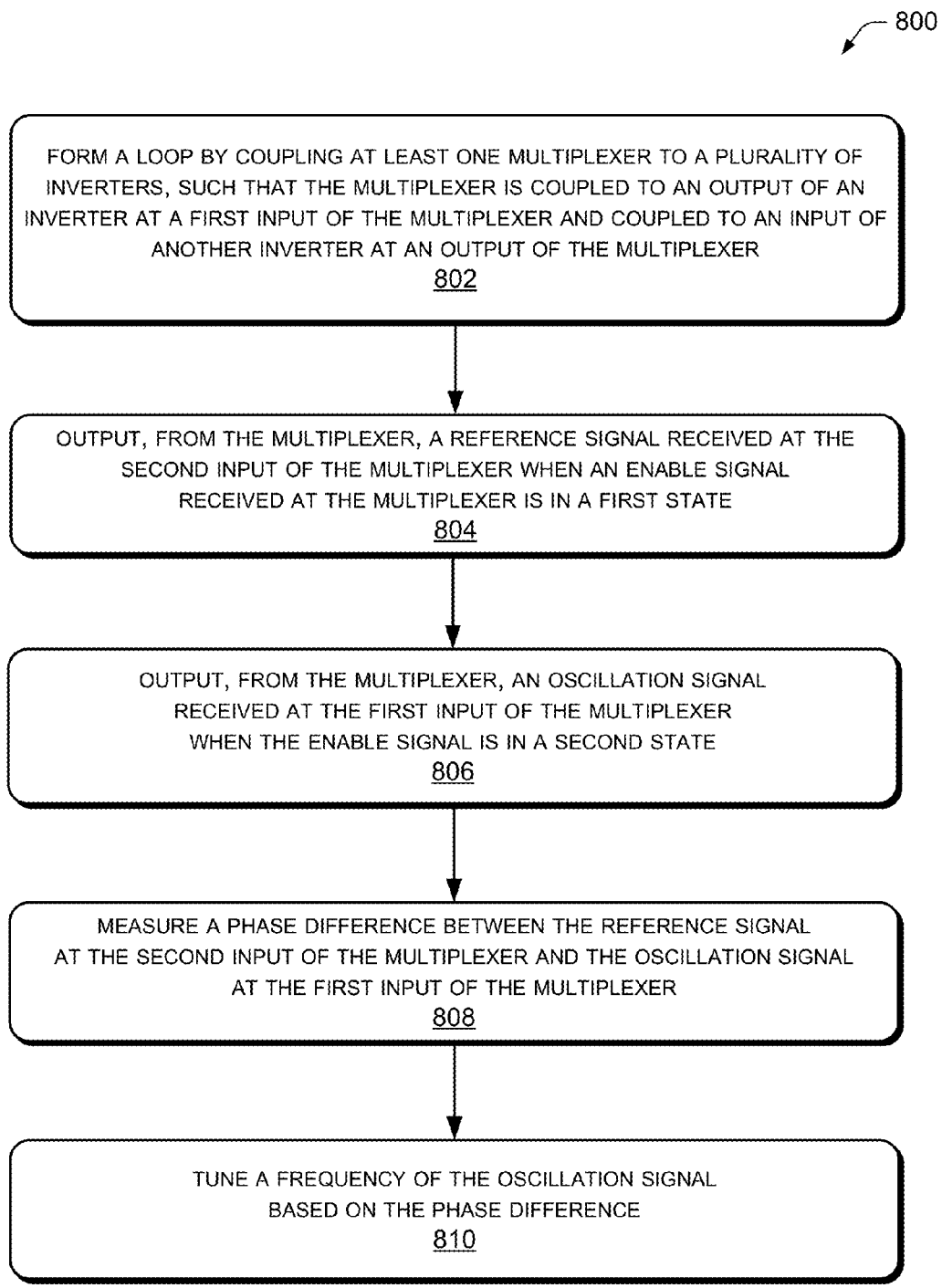
FIG. 8 is a flow diagram illustrating an example process for reducing jitter of an oscillator, according to an implementation.

FIG. 8 is a flow diagram illustrating an example process 800 for reducing jitter of an oscillator (such as an oscillator 106, 400, 500, or 700, for example), according to an implementation. The process 800 is described with reference to FIGS. 1-7.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

At block 802, the process includes forming a loop by coupling at least one multiplexer (such as multiplexer 502, for example) to a plurality of inverters (such as inverters 402, for example), such that the multiplexer is coupled to an output of an inverter at a first input of the multiplexer and coupled to an input of another inverter at an output of the multiplexer. In an implementation, the process includes generating an oscillation signal via the plurality of inverts and the at least one multiplexer in the loop. For example, in an implementation, the plurality of inverters and the at least one multiplexer comprise and oscillator (such as an oscillator 500, 700 for example). In one implementation, the plurality of inverters and the at least one multiplexer comprise a realigned digitally controlled ring oscillator (DCRO) or voltage controlled oscillator (VCO) with built in phase-detectors (such as phase detectors 504, for example).

In an implementation, the process includes receiving a reference signal at a second input of the at least one multiplexer. At block 804, the process includes outputting, from the multiplexer, the reference signal received at the second input of the multiplexer when an enable signal received at the multiplexer is in a first state. In an implementation, this comprises injecting an edge of the reference signal onto the oscillation signal when the multiplexer is enabled.

At block 806, the process includes outputting, from the multiplexer, an oscillation signal received at the first input of the multiplexer when the enable signal is in a second state. In an implementation, the enable signal comprises a binary selection signal, and indicates a selection of the reference signal in the first binary state and indicates a selection of the oscillation signal in the second binary state (or vice versa, depending on the inputs of the multiplexer). In the implementation, the selected signal is output from the multiplexer.

In an implementation, the process includes realigning a phase and/or a frequency of the oscillation signal by enabling the multiplexer and injecting an edge of the reference signal into the multiplexer during a time window encompassing an edge of the oscillation signal, and replacing the edge of the oscillation signal by the edge of the reference signal during the time window.

In an implementation, the process includes coupling a phase detector (such as phase detector 504, for example) to the first input of the multiplexer at a first input of the phase detector and to the second input of the multiplexer at a second input of the phase detector. At block 808, the process includes locally (e.g., at the multiplexer inputs) measuring a phase difference between the reference signal at the second input of the multiplexer and the oscillation signal at the first input of the multiplexer with the phase detector.

At block 810, the process includes tuning a frequency of the oscillation signal based on the phase difference measured. In an example, the process includes outputting the phase difference to a charge pump and/or a loop filter (such as charge pump and/or loop filter 506, for example), and increasing or decreasing a frequency of the oscillation signal via the charge pump and/or the loop filter, based on the phase difference.

In an implementation, the process includes alternately coupling a plurality of multiplexers to the plurality of inverters, such that a multiplexer is coupled to an output or each inverter at a first input of the multiplexer and an inverter is coupled to an output of each multiplexer at an input of the inverter. For example, the process includes generating the oscillation signal via the plurality of inverters, and the plurality of multiplexers in the loop.

In an implementation, the process includes receiving the reference signal at a second input of each multiplexer and independently enabling each multiplexer of the plurality of multiplexers via the enable signal according to a predetermined frequency and/or a predetermined pattern. In one example, the process includes enabling a multiplexer and injecting a reference signal edge at every cycle of the reference signal. In another example, the frequency comprises a combination of an integer multiplication factor and a fractional multiplication factor of a frequency of the reference signal. In a further example, a resolution of the oscillator may be increased by enabling a multiplexer and injecting a reference edge at every second, third, etc. cycle of the reference signal.

In an implementation, the process includes outputting, from each multiplexer, the reference signal when an enable signal received at the multiplexer is in a first state, and outputting, from each multiplexer, an oscillation signal received at the first input of the multiplexer when the enable signal received at the multiplexer is in a second state. In the implementation, the process includes reducing jitter of the oscillation signal by opening the loop and replacing an edge of the oscillation signal by an edge of the reference signal according to the predetermined frequency.

For example, in one implementation, arising edge of the reference signal is replaced for a rising edge of the oscillation signal when a multiplexer is enabled. In another implementations, the resolution of the oscillator may be increased by injecting onto a falling edge of the oscillation signal. In other words, a falling edge of the reference signal is replaced for a falling edge of the oscillation signal when a multiplexer is enabled.

In an implementation, the process includes coupling a plurality of phase detectors to the plurality of multiplexers, such that each phase detector is coupled to a first input of a multiplexer at a first input of the phase detector and to a second input of the multiplexer at a second input of the phase detector. In an example, the process includes locally measuring a phase difference between the reference signal at the second input of each multiplexer and the oscillation signal at the first input of each multiplexer and tuning a frequency of the oscillation signal based on the phase differences measured.

In an implementation, the process includes using a control module (such as control module 702, for example) to determine which edge of the oscillation signal to inject an edge of the reference signal onto (e.g., which edge of the oscillation signal to replace with an edge of the reference signal) and/or which multiplexer to enable.

In various implementations, the multiplexers, or the plurality of multiplexers are enable in an order different from the order in which they are electrically coupled in a loop within the oscillator. In an example, the multiplexers are enabled in an order based on a correlation of an edge of the reference signal and an edge of the oscillation signal (e.g., the multiplexer is enabled where an edge of the reference signal is closest to an edge of the oscillation signal).

In an implementation, the oscillator is included as part of a phase-locked loop (PLL) arrangement or system (such as PLL 100, 200 for example).

In alternate implementations, other techniques may be included in the process 700 in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. A ring oscillator circuit, comprising:
   a plurality of inverters coupled in series;
   a plurality of multiplexers, each multiplexer of the plurality of multiplexers being coupled to an output of an inverter of the plurality of inverters at a first input of the multiplexer and coupled to an input of another inverter of the plurality of inverters at an output of the multiplexer, wherein each multiplexer of the plurality of multiplexers is arranged to receive a reference signal at a second input of the multiplexer and to output the reference signal when an enable signal received at the multiplexer is in a first state and to output an oscillation signal received at the first input of the multiplexer when the enable signal is in a second state; and
   a phase detector coupled to the first input of a respective multiplexer of the plurality of multiplexers at a first input of the phase detector and coupled to the second input of the respective multiplexer at a second input of the phase detector.

2. The ring oscillator circuit of claim 1, further comprising a charge pump and/or a loop filter coupled to an output of the phase detector and arranged to tune a frequency of the oscillation signal based on the output of the phase detector.

3. The ring oscillator circuit of claim 2, wherein the phase detector is arranged to output an error signal to the charge pump and/or the loop filter, the charge pump and/or the loop filter increasing or decreasing a frequency of the oscillation signal based on the error signal.

4. The ring oscillator circuit of claim 1, wherein the phase detector is arranged to measure a phase difference or a frequency difference between the oscillation signal and the reference signal at a predetermined point within the ring oscillator circuit and to output a difference signal based on the measuring.

5. The ring oscillator circuit of claim 1, wherein the phase detector is located within a core of the oscillator circuit and is integral to the oscillator circuit.

6. The ring oscillator circuit of claim 1, wherein the plurality of inverters and the plurality of multiplexers are arranged in a loop and generate the oscillation signal, and wherein the loop is opened at periodic intervals and an edge of the reference signal is replaced for an edge of the oscillation signal at the intervals.

7. The ring oscillator circuit of claim 6, wherein the replacement of the edge of the reference signal for the edge of the oscillation signal adjusts a timing of the oscillation signal.

8. The ring oscillator circuit of claim 1, wherein the reference signal comprises a periodic pulse signal having a rising edge and a falling edge on each pulse, one of the rising edge or the falling edge replacing an rising or falling edge of the oscillation signal at an output of a respective multiplexer of the plurality of multiplexers when the enable signal received at the respective multiplexer is in the first state.

9. A phase-locked loop (PLL) system, comprising:
a multi-stage ring oscillator circuit, including a plurality of multiplexers coupled to a plurality of inverters in a loop, the plurality of multiplexers coupled to the plurality of inverters such that a given multiplexer of the plurality of multiplexers is coupled to an output of a first respective inverter of the plurality of inverters at a first input of the given multiplexer and a second respective inverter of the plurality of inverters is coupled to an output of the given multiplexer at an input of the second respective inverter;
a phase detector coupled to the first input of a particular multiplexer of the plurality of multiplexers at a first input of the phase detector and to a second input of the particular multiplexer at a second input of the phase detector, the phase detector located within the multi-stage ring oscillator circuit; and
a control module arranged to enable the particular multiplexer via an enable signal according to a predetermined pattern, the particular multiplexer arranged to receive a reference signal at the second input of the particular multiplexer and to output the reference signal when the enable signal received at the particular multiplexer is in a first state and to output an oscillation signal received at the first input of the particular multiplexer when the enable signal is in a second state.

10. The PLL system of claim 9, further comprising a loop filter and/or a charge pump arranged to receive an output from the phase detector and to tune a frequency of the multistage ring oscillator circuit based on the output from the phase detector.

11. The PLL system of claim 9, further comprising a plurality of phase detectors coupled to the plurality of multiplexers, a given phase detector of the plurality of phase detectors coupled to a first input of a respective multiplexer of the plurality of multiplexers at a first input of the given phase detector and to a second input of the respective multiplexer at a second input of the given phase detector, the plurality of phase detectors arranged to detect a phase difference between an oscillation signal received at the first input of the given phase detector and a reference signal received at the second input of the given phase detector and to output a difference signal to the control module based on the detecting.

12. The PLL system of claim 9, wherein the plurality of multiplexers are enabled at a frequency comprising a combination of an integer multiplication factor and a fractional multiplication factor of a frequency of the reference signal and in a predetermined pattern.

13. The PLL system of claim 9, wherein the particular multiplexer is arranged to replace an edge of the reference signal for an edge of the oscillation signal when the second input of the particular multiplexer is selected via the enable signal.

14. The PLL system of claim 9, wherein the control module is arranged to realign a phase and/or a frequency of the oscillation signal by enabling the particular multiplexer and injecting an edge of the reference signal into the particular multiplexer during a time window encompassing an edge of the oscillation signal, the edge of the reference signal replacing the edge of the oscillation signal during the time window.

15. The PLL system of claim 14, wherein the control module is arranged to match a timing delay between an injected reference signal at the second input of the particular multiplexer and the oscillation signal at the first input of the particular multiplexer.

16. The PLL system of claim 9, wherein the multi-stage ring oscillator circuit comprises a digitally controlled ring oscillator (DCRO) or an analog voltage controlled oscillator (VCO).

17. A method, comprising:
alternately coupling a plurality of multiplexers to a plurality of inverters such that a given multiplexer of the plurality of multiplexers is coupled to an output of a first respective inverter of the plurality of inverters at a first input of the given multiplexer and a second respective inverter of the plurality of inverters is coupled to an output of the given multiplexer at an input of the second respective inverter;
receiving, by each multiplexer of the plurality of multiplexers, a reference signal such that the reference signal is received at a second input of a given multiplexer of the plurality of multiplexers;
outputting, from each multiplexer of the plurality of multiplexers, the reference signal when an enable signal received at a given multiplexer of the plurality of multiplexers is in a first state;
outputting, from each multiplexer of the plurality of multiplexers, when the enable signal is received at a given multiplexer is in a second state, an oscillation signal that is received at the first input of the given multiplexer;
measuring phase differences for the plurality of multiplexers, wherein measuring the phase differences comprises measuring a phase difference between the reference signal received at the second input of a given multiplexer of the plurality of multiplexers and the oscillation signal received at the first input of the given multiplexer; and
tuning the frequency of the oscillation signal based on the respective phase differences.

18. The method of claim 17, further comprising coupling a phase detector to the first input of a particular multiplexer of the plurality of multiplexers at a first input of the phase detector and to the second input of the particular multiplexer at a second input of the phase detector and wherein measuring the phase differences comprises measuring the phase difference locally at the particular multiplexer.

19. The method of claim 17, wherein tuning the frequency comprises outputting the phase differences to a charge pump and/or a loop filter, and increasing or decreasing a frequency of the oscillation signal via the charge pump and/or the loop filter, based on the phase differences.

20. The method of claim 17, wherein tuning the frequency comprises realigning a phase and/or a frequency of the oscillation signal by enabling a particular multiplexer of the plurality of multiplexers and injecting an edge of the reference signal into the particular multiplexer during a time window encompassing an edge of the oscillation signal, and replacing the edge of the oscillation signal by the edge of the reference signal during the time window.

21. The method of claim 17, further comprising coupling a plurality of phase detectors to the plurality of multiplexers, such that a given phase detector of the plurality of phase detectors is coupled to a first input of a respective multiplexer of the plurality of multiplexers at a first input of the given phase detector and to a second input of the respective multiplexer at a second input of the given phase detector.

22. The method of claim 17, further comprising independently enabling each multiplexer of the plurality of multiplexers according to a predetermined frequency comprising a combination of an integer multiplication factor and a fractional multiplication factor of a frequency of the reference signal.

23. The method of claim 17, further comprising generating the oscillation signal via the plurality of inverters and the plurality of multiplexers in the loop, and reducing jitter of the oscillation signal by opening the loop and replacing an edge of the oscillation signal by an edge of the reference signal according to a predetermined frequency.

* * * * *